United States Patent [19]

Leach et al.

[11] 4,381,470

[45] Apr. 26, 1983

[54] STRATIFIED PARTICLE ABSORBER

[75] Inventors: Jerry G. Leach, Hudson, N.H.; James T. Fearnside, Lexington, Mass.

[73] Assignee: Hewlett-Packard Company, Palo Alto, Calif.

[21] Appl. No.: 219,633

[22] Filed: Dec. 24, 1980

[51] Int. Cl.³ .............................................. H01L 41/08

[52] U.S. Cl. ...................................... 310/327; 310/334

[58] Field of Search ............... 310/322, 325, 326, 327, 310/334, 335, 336, 337, 345

[56] References Cited

U.S. PATENT DOCUMENTS 3,663,842 5/1972 Miller .............................. 310/335 X 4,101,795 7/1978 Fukumoto et al. ................. 310/336

*Primary Examiner*—William M. Shoop

*Assistant Examiner*—Peter S. Wong

*Attorney, Agent, or Firm*—Donald N. Timbie

[57] ABSTRACT

The base for an array of piezoelectric crystals contains tungsten particles that are compression-molded in a binder, the size of the particles at and near the surface on which the crystals are mounted being smaller than the size of the particles remote from the surface.

3 Claims, 1 Drawing Figure

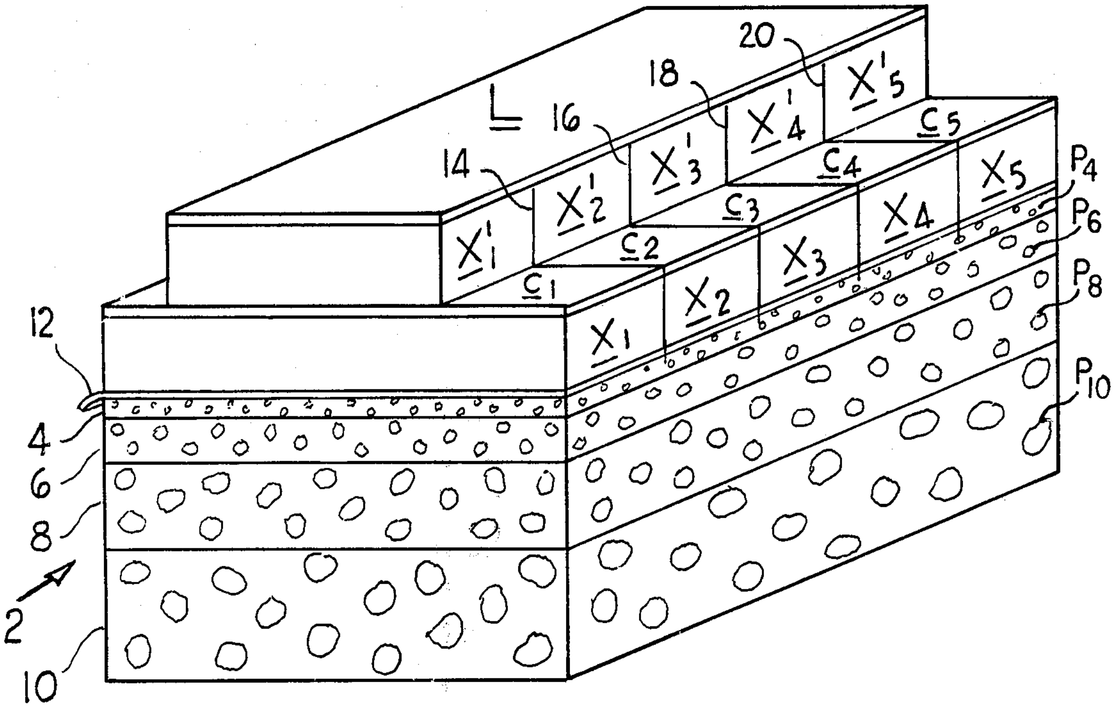
L
20
18
16
14
X'1
X'2
X'3
X'4
X'5
C1
C2
C3
C4
C5
X1
X2
X3
X4
X5
P4
P6
P8
P10
12
4
6
8
2
10

STRATIFIED PARTICLE ABSORBER

BACKGROUND OF THE INVENTION

This invention relates to improvements in electro-acoustic transducers of the type used to transmit and receive pulses of pressure waves in ultrasonic equipment. Such transducers are generally comprised of an array of piezoelectric crystals mounted in parallel spaced relationship on the surface of a base of sound-absorbing material having an acoustic impedance matching that of the crystals. The base may be formed by compression-molding a composition of an acoustically high impedance material, such as tungsten powder, and an acoustically absorbing binder, such as poly vinyl chloride. In order to increase the energy absorption of the base by Rayleigh scattering, the tungsten particles are made rather large in diameter, usually greater than one-tenth the wavelength of the sound to be attenuated. In constructing such a transducer, it is customary to adhere a large crystal to the surface of the base and saw through it in parallel spaced planes so as to form the separate crystals of the array. In accordance with an invention by Amin Hanafy, set forth in his U.S. patent application Ser. No. 083,693, filed on Oct. 11, 1979, now U.S. Pat. No. 4,277,712, and entitled "Acoustic Electric Transducer with Slotted Base," harmful coupling between the crystals of the array by surface waves is substantially reduced by extending the cuts into the base. This has proven difficult to do because the saw blades frequently break when attempting to cut into the large tungsten particles referred to.

Furthermore, in order to avoid reflection at the interface of the base and the crystals and to avoid using a thick layer of adhesive in attaching the crystals to the base, it is desirable that the surface of the base to which the crystals are adhered be smooth and uniform as pointed out in U.S. patent application Ser. No. 052,705, filed June 28, 1979, in the name of J. Fleming Dias and entitled "Acoustic Imaging Transducer." The surface is prepared by polishing, but it has been found that the tungsten particles can be pulled entirely out of suitable energy absorbing binders such as poly vinyl chloride so as to leave a rough surface filled with small craters which cause undesired reflections of acoustic energy.

BRIEF DESCRIPTION OF THE INVENTION

A transducer constructed in accordance with this invention largely eliminates the problems noted above and is comprised of a base of acoustic energy absorbing material molded from a mixture of an acoustic energy attenuating binder such as poly vinyl chloride and high acoustic impedance particles of different sizes in such manner that the portion of small particles decreases with distance from the surface of the base to which the crystals are adhered. The particles adjacent the crystals are small so that they can easily be removed by the saw without damage to it. The particles removed by polishing are small so as to leave a surface that is so smooth that the adhesive used to attach the crystals can be uniformly thin.

It has been found that the conductivity of the surface to which the crystals are adhered is not sufficient for all crystal elements to be at the same electrical potential during operation. Accordingly, a thin conductive layer is formed on the surface prior to attachment of the crystals. This is required in order to provide electrodes that can be grounded in one form of crystal construction or can serve as signal electrodes in another form of construction.

DETAILED DESCRIPTION OF THE INVENTION

In the drawing, a base 2 is divided into four layers 4, 6, 8 and 10. The base 2 could be constructed by depositing layers of tungsten powder of different sizes, each mixed with an acoustically absorbing binder, such as poly vinyl chloride, in a mold and compressing the layers under a force of as much as 40,000 psi. It will be noted that instead of being of uniform size as in the prior art, the size of the particles increases with the distance of a layer from the outer surface of the layer 4, as indicated by $P_4$, $P_6$, $P_8$ and $P_{10}$. It is to be understood, however, that the sizes of particles in each layer do not have to be the same; in fact, they will probably be different with the density of particles of one size being much greater than the density of particles of other sizes. This results from the fact that the powders of particles from which the base is compression-molded contain particles predominantly of one size but also contain smaller particles. It would also be possible, but not necessary, to arrange for the size of the particles to gradually increase with the distance from the outer surface of the layer 4.

An array of crystals such as $X_1$, $X_2$, $X_3$, $X_4$ and $X_5$ is attached to the outer surface of the layer 4. In order to provide a uniform low resistance connection to the undersides of these crystals, a thin film deposition of metal such as gold is applied; and in order to provide an electrical connection to the thin film deposition, a layer of conductive foil 12 is deposited in the upper surface of the layer 4. If the invention of U.S. patent application Ser. No. 020,007, filed on Mar. 12, 1979, now U.S. Pat. No. 4,240,003, in the name of John Larsen and entitled "Apparatus and Method for Supressing Mass/Spring Mode in Acoustic Imaging Transducers" is to be used, a second array of slightly shorter crystals $X_1'$, $X_2'$, $X_3'$, $X_4'$ and $X_5'$ are contiguously mounted on the first array of crystals and respectively separated therefrom by conductive layers $c_1$, $c_2$, $c_3$, $c_4$ and $c_5$. A metal layer L that serves as a ground plane is formed on top of the upper array of crystals $X_1'$ through $X_5'$ and in electrical contact therewith. Because the crystals in the upper array are shorter than the crystals of the lower array, the conductive strips $c_1$ through $c_5$ are exposed at their ends so as to provide lands to which electrical leads may be attached.

In fabricating the transducer, the base 2 is compression-molded as previously described and the conductive layer 12 is deposited on the upper surface of the layer 4. A first single crystal is adhered to the conductive layer 12 and another conductive layer is attached to the upper surface of the first single crystal. A second single crystal is then attached to the metal layer. Parallel saw cuts such as indicated at 14, 16, 18 and 20 are made through the first single crystal to form the separate crystals $X_1'$ through $X_5'$, through the conductive layer 12 to form the strips $c_1$ through $c_5$; and through the second single crystal to form the separate crystals $X_1$ through $X_5$. For reasons set forth in the previously identified U.S. patent application of Amin Hanafy, the saw cuts are continued through the conductive layer 12 into the top layer 4 of the base 2. Heretofore, large tungsten particles of one-tenth of a wavelength or greater were uniformly distributed throughout the base in order to improve its ability to absorb acoustic energy, but as previously noted, the large particles damaged the saw blade. This is avoided if the size of the tungsten particles $P_4$ is such that they do not bind the blade when they are pulled loose from the binder by the sawing action and work their way into the spaces between the sides of the blade and the sides of the slot. In general, the maximum size of the particles will be much less than the width of the slot.

What is claimed is:

1. A transducer, comprising an acoustic energy absorbing base, an array of piezoelectric crystals mounted in spaced parallel relationship on said base, there being cuts in said base aligned with the spaces between said crystals, said base having been molded from a mixture of high acoustic impedance particles of different sizes and a binder for the particles, the portion of the particles of a smaller size decreasing in a direction away from the interface of said base and said array of crystals, but the density of the particles by weight being the same throughout the base so as to have an acoustic impedance approximately equal to that of said crystals.

2. A transducer as set forth in claim 1 wherein said high acoustic impedance particles are tungsten.

3. A transducer as set forth in claim 2 wherein a portion of said base adjacent said array of crystals is comprised of a thermoplastic polymer.

* * * * *